(12) United States Patent
Li et al.

(10) Patent No.: US 8,330,554 B2
(45) Date of Patent: Dec. 11, 2012

(54) RADIO FREQUENCY FILTER

(75) Inventors: Shen-Chun Li, Taipei Hsien (TW);
Shou-Kuo Hsu, Taipei Hsien (TW);
Yung-Chieh Chen, Taipei Hsien (TW);
Hsien-Chuan Liang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 544 days.

(21) Appl. No.: 12/629,888

(22) Filed: Dec. 3, 2009

(65) Prior Publication Data

US 2011/0050361 A1 Mar. 3, 2011

(30) Foreign Application Priority Data

Aug. 28, 2009 (CN) .......................... 2009 1 0306260

(51) Int. Cl.
*H03H 7/01* (2006.01)

(52) U.S. Cl. ....................................... 333/168; 333/185
(58) Field of Classification Search .................. 333/168, 333/175, 185, 202, 206, 207, 248, 176
See application file for complete search history.

(56) References Cited

U.S. PATENT DOCUMENTS 2,527,608 A * 10/1950 Willoughby .................. 333/174

* cited by examiner

*Primary Examiner* — Benny Lee
*Assistant Examiner* — Gerald Stevens
(74) *Attorney, Agent, or Firm* — Altis Law Group, Inc.

(57) ABSTRACT

Parameters of a radio frequency filter can be changed by changing structure of each component of the filter. Material of each component, diameters of each of magnetic cylinders, density of each of conductive coils, thickness of a dielectric layer, and thickness of an insulation tube can be changed. When any component needs to be replaced, each cover is rotated, with connection partitions move to two slots of a resisting portion, to detach the filter.

9 Claims, 5 Drawing Sheets

RADIO FREQUENCY FILTER

BACKGROUND

1. Technical Field

The present disclosure relates to radio frequency (RF) filters, and particularly to an adjustable RF filter.

2. Description of Related Art

In response to various frequency bands of an electronic device, filters have also been demanded to remove noise in frequency bands. Filters are generally designed to remove noise from specific frequency bands, therefore different filters to be designed for different applications. Filters designed in this way are not easily adjustable for use in applications other than what they were specifically designed for.

DETAILED DESCRIPTION

Figure 1:
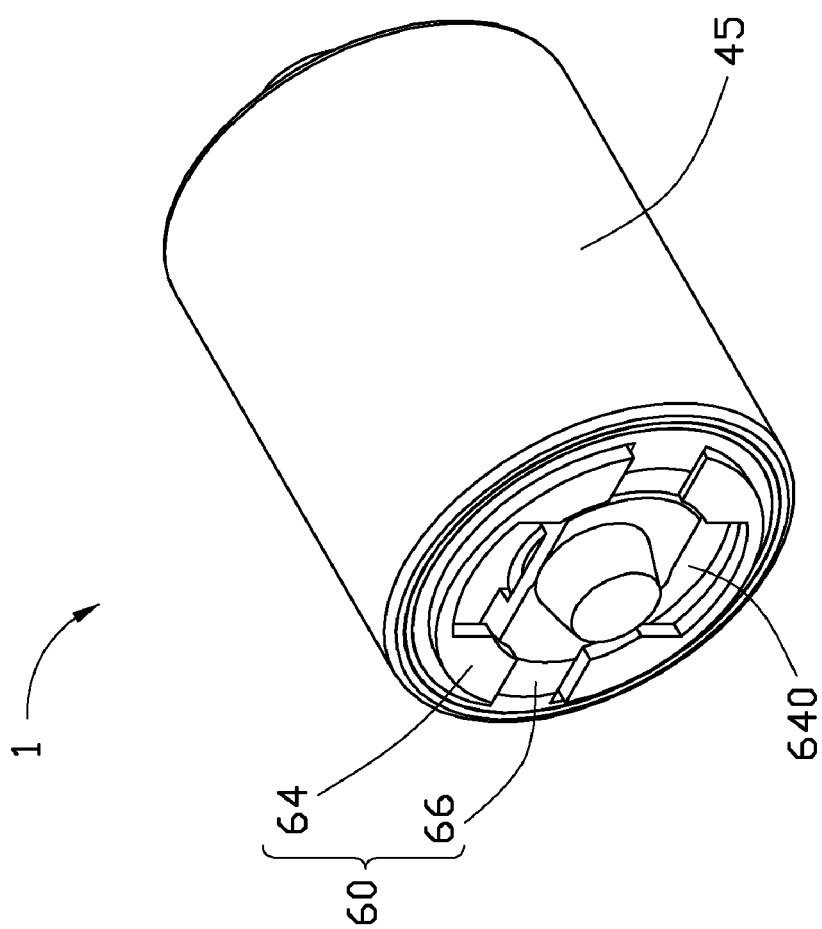
FIG. 1 is a perspective, isometric view of an exemplary embodiment of a RF filter.
Figure 2:
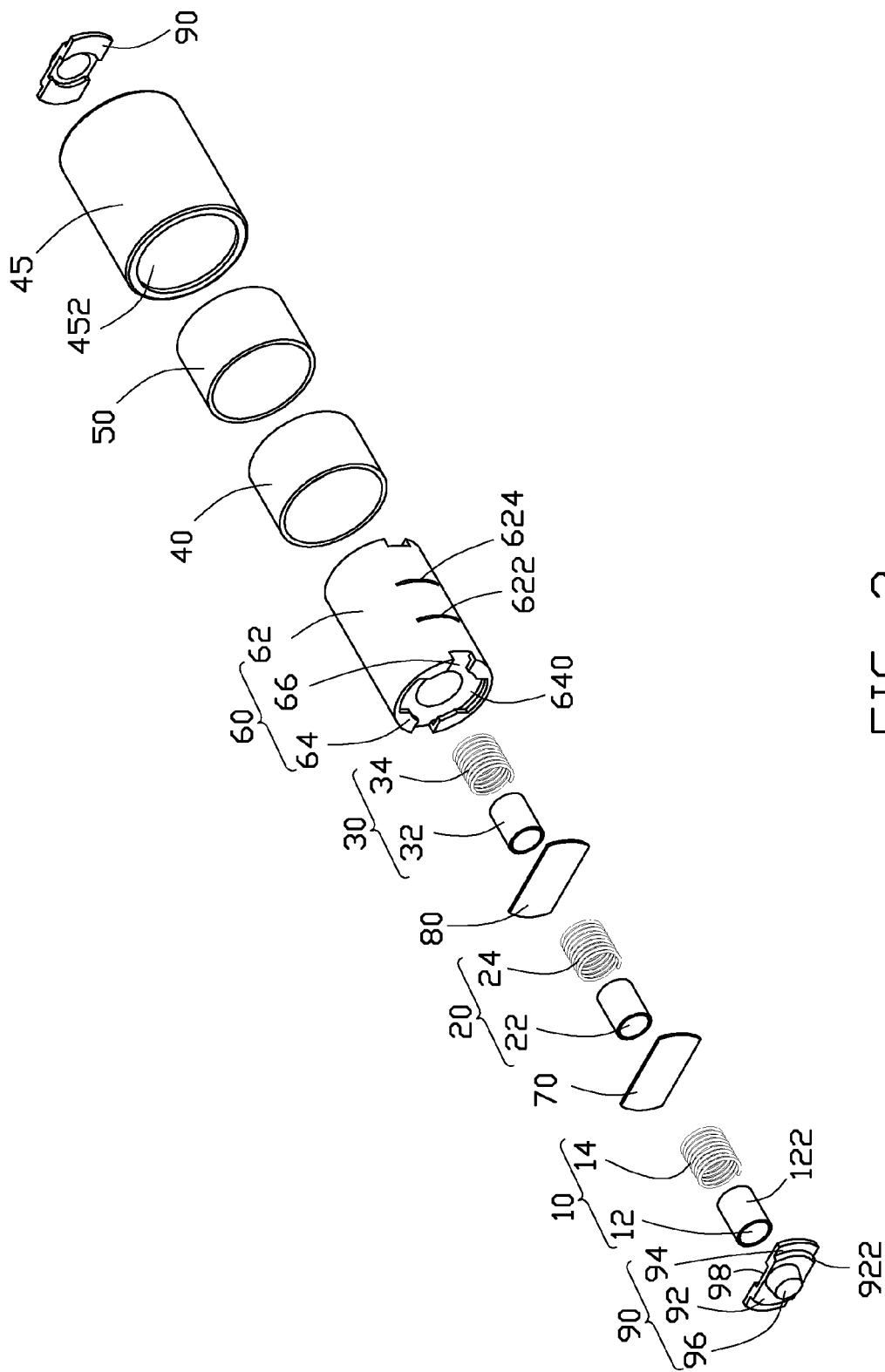
FIG. 2 is an exploded, isometric view of the RF filter of FIG. 1, the RF filter including an insulation tube.

Referring to FIGS. 1 and 2, an exemplary embodiment of a radio frequency (RF) filter 1 includes three inductive components 10, 20, and 30, a first capacitive component, a second capacitive component, an insulation tube 60, two conductive tabs 70 and 80, and two covers 90.

The first capacitive component includes a metal inner tube 40. The second capacitive component includes a metal inner tube 50. The first and second capacitive components share a metal outer tube 45. The metal outer tube 45 is grounded. The metal inner tubes 40 and 50 are aligned with each other and fit about the insulation tube 60. The inductive components 10, 20, and 30 are aligned with one another and located inside the insulation tube 60. The conductive tab 70 is located between the inductive components 10 and 20. The conductive tab 80 is located between the inductive components 20 and 30. A length of each of the metal inner tubes 40 and 50 is greater than a length of each of the inductive components 10, 20, and 30, while less than a sum of the lengths of any two of the inductive components 10, 20, and 30. A dielectric layer 452 covers an inner wall of the metal outer tube 45. The inductive components 10, 20, and 30 have inductor characteristics. The first and second capacitive components also have capacitor characteristics.

The inductive component 10 includes a magnetic cylinder 12 and an elastic helical conductive coil 14. A dielectric layer 122 covers an outer surface of the magnetic cylinder 12. The conductive coil 14 coils around the magnetic cylinder 12. The magnetic cylinder 12 can be made of magnetizable material, such as iron, cobalt, nickel, etc, and the dielectric layer 122 can be made of glass fiber oxide resin.

The inductive component 20 includes a magnetic cylinder 22 and a conductive coil 24. The inductive component 30 includes a magnetic cylinder 32 and a conductive coil 34. A dielectric layer covers an outer surface of each of the magnetic cylinders 22 and 32. The inductive components 20 and 30 have the same structure and are made of the same material as the inductive component 10.

Figure 3:
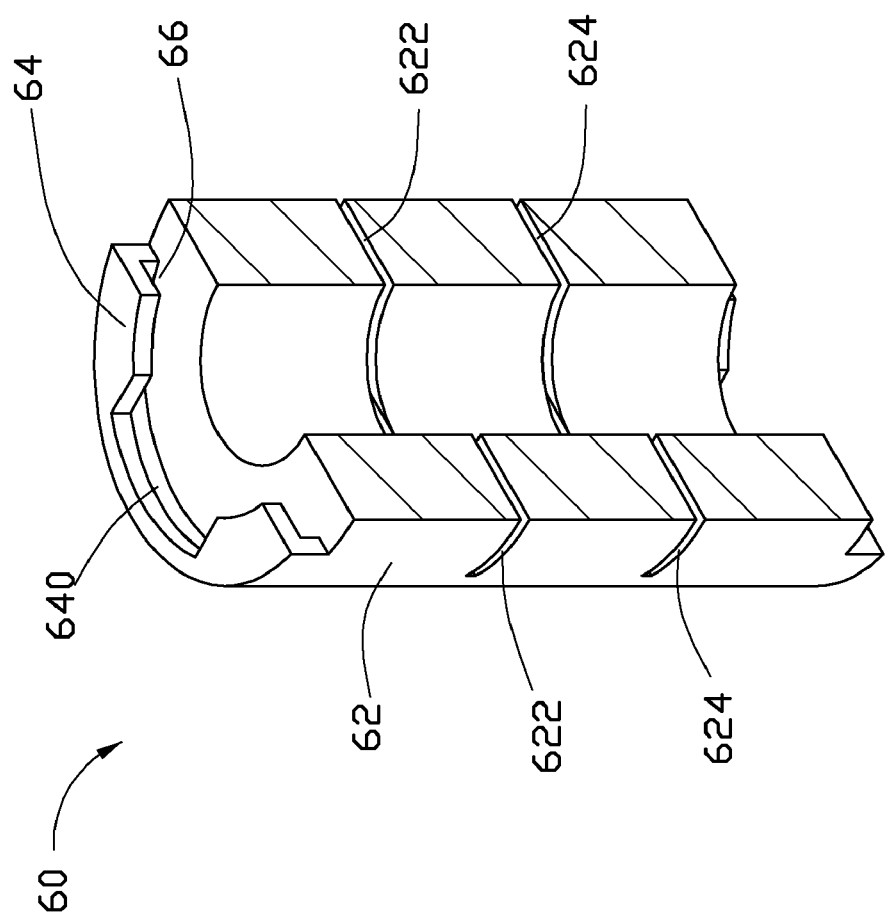
FIG. 3 is a sectional view of the insulation tube of FIG. 2.

Referring to FIG. 3, the insulation tube 60 includes a hollow cylindrical-shaped main body 62 and two annular-shaped friction fitting portions 64 extending from opposite end surfaces of the main body 62. A receiving groove 66 is defined between the main body 62 and each friction fitting portion 64. Two slots 640 are symmetrically defined in each friction fitting portion 64. Two opposite indentions 622 are defined in a circumference of an inside wall of the main body 62, through the main body 62. Two opposite indentions 624 are defined in the circumference of the inside wall of the main body 62, through the main body 62. In this embodiment, the insulation tube 60 can prevent the inductive components 10, 20, and 30 from interfering with the capacitive components.

Each of the covers 90 having conductive characteristic includes a main body 92 with two opposite arc-shaped edges 922, and two arc-shaped connection portions 94 extending out from the edges 922. The connection portions 94 are depressed to a bottom of the main body 92. A circular-shaped opening 98 is defined in a center of the bottom of the main body 92. A protrusion 96 is formed from a side bounding the opening of the cover 90 and covers the opening. A width of each connection portion 94 is less than or equal to a width of a corresponding slot 640 of the corresponding friction fitting portion 64.

Figure 4:
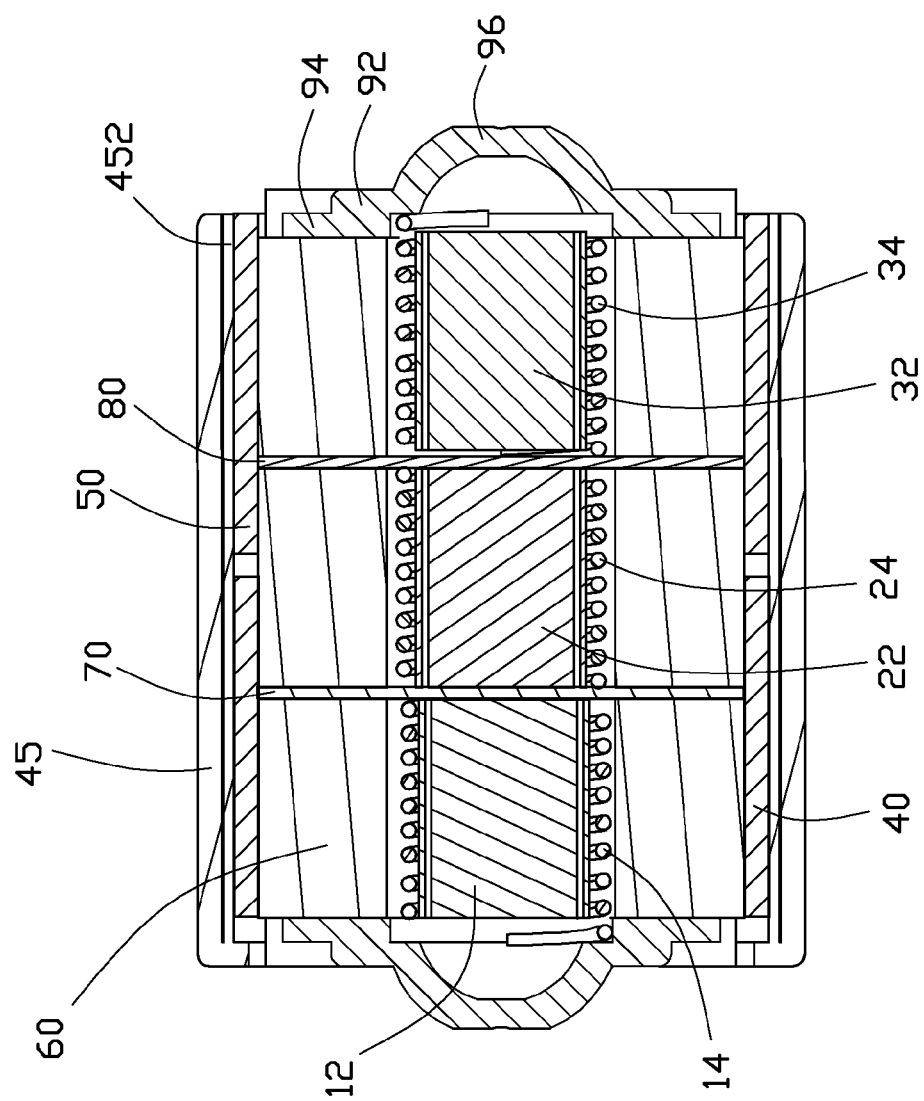
FIG. 4 is a cross-sectional view of the RF filter of FIG. 1.

Referring to FIG. 1 and FIG. 4, in assembly, the inductive components 10, 20, and 30 are aligned with one another and received in the insulation tube 60, with the inductive component 20 sandwiched between the inductive components 10 and 30. The conductive tab 70 passes through the indentions 622 of the insulation tube 60, to be located between the inductive components 10 and 20, with opposite ends of the conductive tab 70 exposing through the indentions 622. The conductive tab 80 passes through the indentions 624 of the insulation tube 60, to be located between the inductive components 20 and 30, with opposite ends of the conductive tab 80 exposing through the indentions 624. The metal inner tubes 40 and 50 are aligned with each other and fit about the insulation tube 60, with the inductive component 10 located in the metal inner tube 40, the inductive component 30 located in the metal inner tube 50, a first end of the inductive component 20 located in the metal inner tube 40, and a second end of the inductive component 20 located in the metal inner tube 50. Therefore, opposite ends of the conductive tab 70 electrically contact the inside wall of the metal inner tube 40, and opposite ends of the conductive tab 80 electrically contact the inner wall of the metal inner tube 50.

The covers 90 are mounted to opposite ends of the insulation tube 60. The connection portions 94 of each cover 90 are received in a corresponding receiving groove 66 from the slots 640 of the friction fitting portion 64, with the two edges 922 of the main body 92 resisting against the friction fitting portion 64. The connection portions 94 can rotatably slide in the receiving groove 66, with the connection portions 94 resisting against the friction fitting portion 64 and the end surface of the main body 62. Therefore, opposite ends of the conductive coil 14 resist against one of the covers 90 and the conductive tab 70, opposite ends of the conductive coil 24 resist against the conductive tabs 70 and 80, and opposite ends of the conductive coil 34 resist against the conductive tab 80 and the other cover 90. Two protrusions 96 of the covers 90 are used as an input terminal and an output terminal of the filter 1, respectively, to connect to an electronic device.

Figure 5:
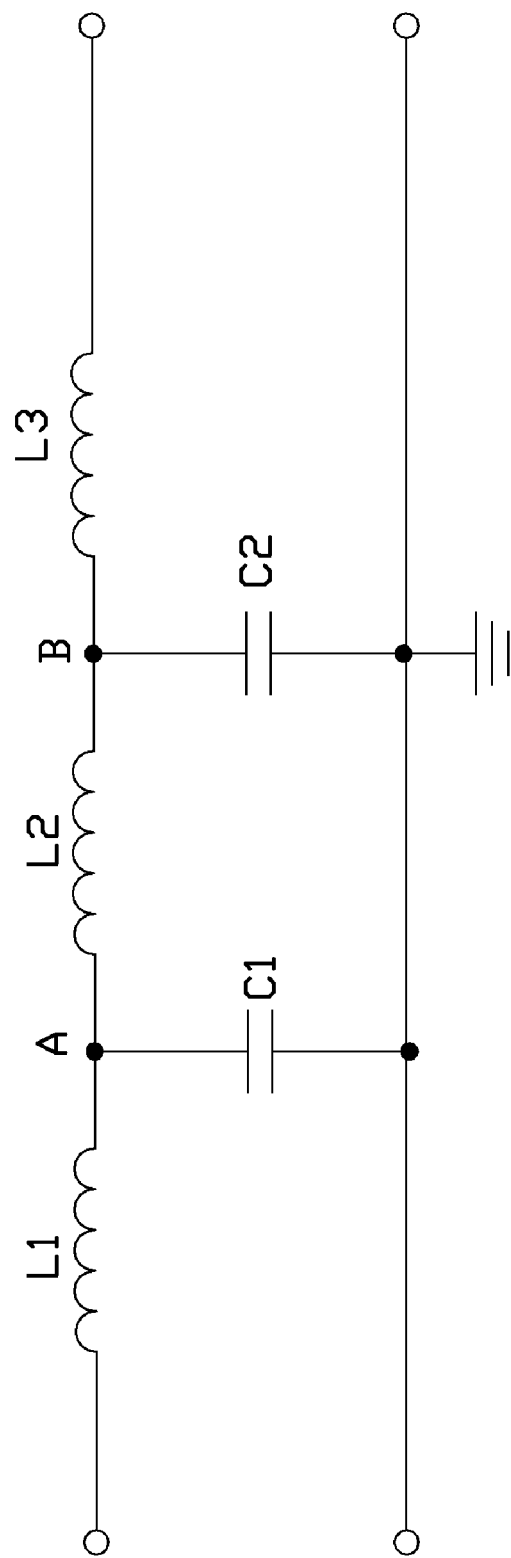
FIG. 5 is an equivalent circuit diagram of the RF filter of FIG. 1.

Referring to FIG. 5, an equivalent circuit of the filter 1 includes three inductors L1-L3, and two capacitors C1 and C2. Where, the inductive component 10 is equivalent to the inductor L1, the inductive component 20 is equivalent to the inductor L2, the inductive component 30 is equivalent to the inductor L3, the first capacitive component including the metal inner tube 40 and the metal outer tube 45 is equivalent to the capacitor C1, the second capacitive component including the metal inner tube 50 and the metal outer tube 45 is equivalent to the capacitor C2, the conductive tab 70 is equivalent to a node A between the inductors L1 and L2, and the conductive tab 80 is equivalent to a node B between the inductors L2 and L3.

The inductors L1, L2, and L3 are connected in series. A first terminal of the capacitor C1 is connected to the node A between the inductors L1 and L2. A first terminal of the capacitor C2 is connected to the node B between the inductors L2 and L3. Second terminals of the capacitors C1 and C2 are grounded. Terminals of the inductor L1 and L3 opposite to the nodes A and B, respectively, are used as the input terminal and the output terminal of the filter 1.

Parameters of the filter 1 can be changed by changing structure of each component of the filter 1. For example, material of each component, diameters of each of the magnetic cylinders 12, 22, and 32, density of each of the conductive coils 14, 24, and 34, thickness of the dielectric layer 452, and thickness of the insulation tube 60 can be changed. When any component needs to be replaced, each cover 90 is rotated, with the connection partitions 94 move to the two slots 640 of the friction fitting portion 64, to detach the filter 1. The number of the inductive components is one more than the number of capacitive components, and a number of the inductive components and the capacitive components can be adjusted as need.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A filter comprising:
   m number of inductive components;
   a metal outer tube;
   n number of capacitive components, each of the n capacitive components comprising a metal inner tube, and sharing the metal outer tube, wherein the metal outer tube is grounded, the metal inner tubes of the n capacitive components are arranged in alignment, the metal inner tubes are located inside the metal outer tube, wherein n is an integer, and n=m−1;
   an insulation tube located outside the m inductive components, the metal inner tubes fit around the insulation tube, the insulation tube defining n pairs of indentions allowing n conductive tabs inserting into the insulation tube therethrough, each of the n conductive tabs located between and electrically connecting a corresponding adjacent pair of the m inductive components, two opposite ends of each of the n conductive tabs exposed through a corresponding pair of indentions to connect to a corresponding one of the metal inner tubes; and
   two covers detachably mounted to opposite ends of the insulation tube, and electrically connected to two of the m inductive components at the opposite ends of the insulation tube.

2. The filter of claim 1, wherein the insulation tube comprises a hollow main body and two friction fitting portions extending from opposite end surfaces of the hollow main body, respectively, a receiving groove is defined between each friction fitting portion and a corresponding one of the opposite end surfaces, to receive a corresponding one of the two covers, and two slots are symmetrically defined in each friction fitting portion, allowing the corresponding one of the two covers to enter into the corresponding receiving groove.

3. The filter of claim 2, wherein each of the two covers comprises a main body, each of the main bodies comprises two opposite edges and two connection portions extending out from the two opposite edges respectively, the two connection portions of each of the main bodies are depressed to a bottom of a corresponding one of the main bodies, the two connection portions of each of the main bodies are received in a corresponding one of the receiving grooves from the two slots of a corresponding one of the friction fitting portions, with the two opposite edges of a corresponding one of the main bodies resisting against a corresponding one of the friction fitting portions, the two connection portions of each of the main bodies are operable to rotatably slide in a corresponding one of the receiving grooves, with the connection portions of each of the main bodies resisting a corresponding one of the friction fitting portions and a corresponding one of the end surfaces of the hollow main body.

4. The filter of claim 2, wherein the each of the n pairs of indentions are defined in a circumference of the insulation tube, through the insulation tube.

5. The filter of claim 1, wherein each of the m inductive components includes a magnetic cylinder and a conductive coil, an outer surface of each of the magnetic cylinders is covered by a dielectric layer, and each of the conductive coils fits about a corresponding one of the magnetic cylinders.

6. The filter of claim 5, wherein each of the dielectric layers is made of glass fiber oxide resin.

7. The filter of claim 6, wherein each of the magnetic cylinders is made of magnetizable material.

8. The filter of claim 1, wherein each of the two covers comprise a main body, an opening is defined in a center of each of the main bodies, a protrusion is formed from each of the main bodies and covers a corresponding one of the openings, to function as an input terminal and an output terminal of the filter, respectively.

9. The filter of claim 1, wherein a length of each metal inner tube is greater than a length of each of the inductive components, while being less than a sum of the lengths of any two of the inductive components.

* * * * *